US011336230B2

(12) United States Patent
Telstø

(10) Patent No.: US 11,336,230 B2
(45) Date of Patent: May 17, 2022

(54) OSCILLATOR CIRCUIT WITH TWO CURRENT SUPPLIES

(71) Applicant: Nordic Semiconductor ASA, Trondheim (NO)

(72) Inventor: Frode Telstø, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 0 days.

(21) Appl. No.: 17/254,223

(22) PCT Filed: Jun. 19, 2019

(86) PCT No.: PCT/EP2019/066298
§ 371 (c)(1),
(2) Date: Dec. 18, 2020

(87) PCT Pub. No.: WO2019/243473
PCT Pub. Date: Dec. 26, 2019

(65) Prior Publication Data
US 2021/0273610 A1 Sep. 2, 2021

(30) Foreign Application Priority Data
Jun. 21, 2018 (GB) .................................... 1810227

(51) Int. Cl.
*H03B 5/06* (2006.01)
*H03B 5/32* (2006.01)
(Continued)

(52) U.S. Cl.
CPC ............... *H03B 5/364* (2013.01); *H03B 5/06* (2013.01); *H03B 5/366* (2013.01); *H03L 3/00* (2013.01);
(Continued)

(58) Field of Classification Search
CPC ... H03B 5/06; H03B 5/30; H03B 5/32; H03B 5/326; H03B 5/36; H03B 5/362;
(Continued)

(56) References Cited

U.S. PATENT DOCUMENTS

| 5,142,251 A | 8/1992 | Boomer |
| 7,098,753 B1 | 8/2006 | Dumitrescu et al. |

(Continued)

FOREIGN PATENT DOCUMENTS

| EP | 1 753 126 A1 | 2/2007 |
| EP | 3 226 410 A1 | 10/2017 |

OTHER PUBLICATIONS

International Search Report and Written Opinion for PCT/EP2019/066298, dated Sep. 27, 2019, 18 pages.

(Continued)

*Primary Examiner* — Levi Gannon
(74) *Attorney, Agent, or Firm* — Klarquist Sparkman, LLP

(57) ABSTRACT

An oscillator circuit comprises a crystal oscillator and an inverter. The input of the inverter is connected to the first terminal of the crystal oscillator and the output of the inverter is connected to the second terminal of the crystal oscillator, oscillator circuit is arranged to operate the inverter in its linear operating region. An amplitude regulator has an input connected to the input of the inverter, arranged to provide a first supply current $I_{AREG}$ to the inverter, where the magnitude of the first supply current is inversely dependent on a magnitude of a voltage at the inverter input. A digital-to-analogue converter is arranged to provide a second supply current $I_{DAC}$ to the inverter having a magnitude determined by a digital signal applied to a digital input of the digital-to-analogue converter.

13 Claims, 2 Drawing Sheets

(51) Int. Cl.
  *H03L 3/00* (2006.01)
  *H03L 5/02* (2006.01)
  *H03B 5/36* (2006.01)
(52) U.S. Cl.
  CPC ........ *H03L 5/02* (2013.01); *H03B 2200/0012* (2013.01); *H03B 2200/0046* (2013.01); *H03B 2200/0094* (2013.01); *H03B 2201/031* (2013.01)
(58) Field of Classification Search
  CPC ........ H03B 5/364; H03B 5/366; H03B 5/368; H03B 2200/0012; H03B 2200/0046; H03B 2200/0094; H03B 2201/031; H03L 3/00; H03L 5/00; H03L 5/02
  See application file for complete search history.

(56) References Cited

U.S. PATENT DOCUMENTS

| | | | |
|---|---|---|---|
| 7,868,710 B1 | 1/2011 | Farahvash et al. | |
| 2006/0071729 A1* | 4/2006 | Cetin | H03B 5/364 331/158 |
| 2007/0096841 A1 | 5/2007 | Connell et al. | |
| 2008/0048795 A1* | 2/2008 | Hoshino | H03L 5/00 331/183 |
| 2008/0143452 A1 | 6/2008 | Rosik et al. | |
| 2009/0224844 A1* | 9/2009 | Orberk | H03L 5/00 331/183 |
| 2012/0098609 A1* | 4/2012 | Verma | H03B 5/36 331/158 |
| 2012/0326794 A1* | 12/2012 | Kammula | H03B 5/362 331/15 |
| 2017/0077931 A1 | 3/2017 | Viegas | |
| 2017/0288680 A1* | 10/2017 | Feng | H03L 3/00 |

OTHER PUBLICATIONS

IPO Search Report under Section 17(5) for GB1810227.7, dated Dec. 20, 2018, 3 pages.

Vittoz, "Quartz Oscillators for Watches," 10$^{th}$ International Congress of Chronometry, No. 3, Sep. 1979, pp. 131-140.

Vittoz, et al., High-Performance Crystal Oscillator Circuits: Theory and Application, *IEEE Journal of Solid State Circuits*, vol. 23, No. 3, Jun. 1988, pp. 774-783.

* cited by examiner

OSCILLATOR CIRCUIT WITH TWO CURRENT SUPPLIES

CROSS REFERENCE TO RELATED APPLICATIONS

This is the U.S. National Stage of International Application No. PCT/EP2019/066298, filed Jun. 19, 2019, which was published in English under PCT Article 21(2), which in turn claims the benefit of Great Britain Application No. 1810227.7, filed Jun. 21, 2018.

TECHNICAL FIELD

The present invention relates to oscillator circuits, in particular circuits that employ a crystal oscillator to generate a signal having a particular frequency.

BACKGROUND

It is a common aim in modern electronic devices to provide a signal having a particular frequency, for example to be used as a clock signal for timing events within other parts of the circuit. An electronic oscillator is an electronic circuit that produces a periodic, oscillating electronic signal, often a sine wave or a square wave.

An oscillator that provides a sinusoidal signal is referred to in the art as a linear oscillator. Typically, a linear oscillator is constructed from an amplifier (e.g. a transistor or operational amplifier) provided with feedback such that its output is fed back into its input through a frequency selective filter in order to provide positive feedback. On powering up, noise in the circuit provides a non-zero signal and this noise is amplified by the feedback loop and filtered until it converges on a sine wave at a single frequency. This generally occurs fairly quickly after powering up the circuit.

Linear oscillators include resistor-capacitor (RC) oscillator circuits, which use a network of resistors and capacitors as the filter; inductor-capacitor (LC) oscillator circuits, which use a network of inductors and capacitors as the filter, and crystal oscillator circuits, which use a piezoelectric crystal (e.g. a quartz crystal) as the filter. It is understood in the art that such crystals may have very high Q-factor and also better temperature stability than tuned circuits, so crystal oscillators have much better frequency stability than LC or RC oscillators.

Some such crystal oscillator circuits, for example those based on the arrangement described in "High-Performance Crystal Oscillator Circuits: Theory and Application," E. A. Vittoz et al., IEEE JSSC June 1988, may use an amplitude regulator circuit to generate the current which is supplied to a so-called 'Pierce inverter' which drives the crystal itself. The amplitude regulator circuit portion limits the current in the Pierce inverter such that the gain is just above the level where oscillations are maintained.

However, such arrangements have the disadvantage that the amplitude regulator may generate too much noise for certain applications, especially in a low power applications. For example, where a current mirror is connected between the amplitude regulator and the Pierce inverter, noise may be problematic due to the gain in the current mirror being relatively high because this gain directly amplifies the noise generated in the amplitude regulator.

One alternative solution may be to use a fixed, low noise current source to supply the current into the Pierce inverter (e.g. via a current mirror), instead of the amplitude regulator. However, the Applicant has appreciated that doing so may come at a significant cost because such an arrangement may cause excessive current consumption for some crystals, while it may supply too small a current to be able to drive some other crystals. Such an arrangement would therefore need to be designed specifically for a particular crystal, or for a set of crystals having their parameters within a very limited range, thereby limiting the applications for which a given integrated circuit can be used. Those skilled in the art will appreciate that, typically, a crystal may be characterised and modelled by a set of parameters: a capacitor (C0) in parallel with a serial resistor (R1), capacitor (C1) and inductor (L1), in addition to the load capacitance (CL). In some examples, an equivalent series resistance (ESR) is used instead of R1.

Generally, the use of a fixed current source will lead to significantly longer start-up time, as the current (and thus gain) in the Pierce inverter will be constant, while in the case with an amplitude regulator, the current (and gain) in the Pierce inverter will typically be significantly higher when the amplitude produced by the crystal oscillator is low.

SUMMARY OF THE INVENTION

When viewed from a first aspect, the present invention provides an oscillator circuit comprising:
  a crystal oscillator having first and second terminals;
  an inverter having an input terminal and an output terminal, wherein the input terminal of the inverter is connected to the first terminal of the crystal oscillator and the output terminal of the inverter is connected to the second terminal of the crystal oscillator, and wherein the oscillator circuit is arranged to operate the inverter in its linear operating region;
  an amplitude regulator having an input terminal thereof connected to the input terminal of the inverter, arranged to provide a first supply current to the inverter, said first supply current having a magnitude inversely dependent on a magnitude of a voltage at the inverter input terminal; and
  a digital-to-analogue converter arranged to provide a second supply current to the inverter having a magnitude determined by a digital signal applied to a digital input of said digital-to-analogue converter.

This first aspect of the invention extends to a method of operating an oscillator circuit comprising:
  a crystal oscillator having first and second terminals;
  an inverter having an input terminal and an output terminal, wherein the input terminal of the inverter is connected to the first terminal of the crystal oscillator and the output terminal of the inverter is connected to the second terminal of the crystal oscillator, and wherein the oscillator circuit is arranged to operate the inverter in its linear operating region;
  an amplitude regulator having an input terminal thereof connected to the input terminal of the inverter, arranged to provide a first supply current to the inverter; and
  a digital-to-analogue converter arranged to provide a second supply current to the inverter;
  wherein the method comprises:
  using the amplitude regulator to determine a first supply current;
  varying the magnitude of the first supply current inversely in response to the magnitude of the voltage at the input terminal of the amplitude regulator;
  using the digital-to-analogue converter to determine a second supply current; and varying the magnitude of the second supply current in response to a digital signal applied to a digital input of said digital-to-analogue converter.

Those skilled in the art will appreciate that, in accordance with embodiments of the invention, there is provided an improved oscillator circuit that may provide significant reductions in phase noise compared to conventional arrangements that use only an amplitude regulator to provide a supply current to the inverter as described above. An oscillator circuit in accordance with embodiments of the present invention use a DAC to provide the supply current to the inverter, where the Applicant has appreciated that a DAC is, generally, less noisy than a conventional amplitude regulator. The digital signal applied to the DAC input sets the value of the supply current provided to the inverter by the DAC. The use of a DAC within such oscillator circuits may also provide more flexibility as to the number of supported crystals compared to a fixed current source approach. The digital signal input to the digital-to-analogue converter may be set to an appropriate value in order to tune the amount of current supplied to the inverter.

However, the Applicant has appreciated that a DAC provides a fixed level of current that is dependent only on the digital control signal. Generally, the DAC is arranged to provide only sufficient current to maintain oscillations (rather than to ramp up the amplitude of the oscillations from zero to the desired amplitude) and so the DAC, if acting alone, may cause the oscillator circuit to take an excessive amount of time before the oscillations reach the desired amplitude after being powered up, e.g. after powering on the device, resuming from a low power mode, or following a reset of the device. In order to address this potential problem, an oscillator circuit in accordance with embodiments of the invention also has an amplitude regulator arranged in parallel which provides a large supply current when the amplitude of the oscillations produced by the crystal oscillator is small, but where the supply current that decreases as the amplitude of the signal produced by the oscillator increases, i.e. the amplitude regulator provides a supply current that, while potentially more susceptible to noise than the current produced by the DAC, may be much larger on start-up but then decreased as the voltage at the input of the inverter (i.e. the signal produced by the oscillator) increases, i.e. once the DAC can maintain the oscillations alone with the fixed current level it provides.

The Applicant has therefore provided an advantageous arrangement in which an amplitude regulator is provided, effectively in parallel with the DAC, such that the inverter may be supplied with current from two different sources, i.e. the amplitude regulator and the DAC. The amplitude regulator may supply a large current on start-up in order to decrease the amount of time before the oscillations reach the desired level while being more susceptible to noise, while the DAC may act as a fixed current source that provides a smaller amount of current than the amplitude regulator at start-up before taking over, but that is less susceptible to noise. The combination of these two different current sources may alleviate the issues outlined above.

The term 'inversely' as used herein with respect to the relationship between the first supply current and the inverter input voltage is to be understood to mean that the magnitude of the first supply current is reduced when the magnitude of the voltage at the input terminal of the amplitude regulator is increased and vice versa. While in some instances this may mean that the first supply current is inversely proportional to the voltage at the input terminal of the amplitude regulator such that the first supply current is zero when the voltage at the input terminal is zero, this is not necessarily always the case. There may be a non-zero offset such that when the first supply current is zero when the voltage at the input terminal is zero, the voltage at the input terminal is non-zero, and vice versa.

Those skilled in the art will appreciate that, at least in some embodiments, the amplitude regulator may provide current (i.e. the 'first' supply current) initially, e.g. on power-up of the oscillator circuit. The current may be supplied by the amplitude regulator until the oscillator portion (i.e. the crystal oscillator and inverter) is producing the oscillatory signal at the desired amplitude, at which point the DAC may provide current (i.e. the 'second' supply current) to the inverter. Thus it will be seen that the amplitude regulator can provide current during an initial set up period. In some embodiments, the amplitude regulator is disabled if the magnitude of the voltage at the input terminal of the amplitude regulator is above a threshold value but the amplitude regulator is enabled if the magnitude of the voltage at the input terminal of the amplitude regulator is not above the threshold value. In a set of embodiments, the threshold value is the magnitude of the first supply current produced by the amplitude regulator when the magnitude of the second supply current is zero.

It will be appreciated, however, that both the amplitude regulator and DAC may, at least in some embodiments, both supply current to the inverter at the same time. For example, the DAC may supply a small current even when the amplitude regulator is enabled.

When in use, the oscillator circuit operates the inverter in its linear operating region. Those skilled in the art will appreciate that operating an inverter in its linear operating region means that it is neither fully on nor fully off, instead operating such that it has gain. In other words, operating an inverter in its linear region may cause it to behave as an inverting amplifier with a relatively high gain. In a set of embodiments, a resistor is connected in parallel with the inverter such that a first terminal of the resistor is connected to the input terminal of the inverter and a second terminal of the resistor is connected to the output terminal of the inverter, wherein the resistor is arranged to bias the inverter to operate in a linear operating region thereof. In accordance with such embodiments, the resistance in parallel with the inverter is arranged to bias the inverter into its linear operating region.

It will be appreciated by those skilled in the art that the inverter may be any suitable inverting amplifier. However, in a set of embodiments, the inverter is a digital inverter, i.e. a logic NOT gate.

The amplitude regulator is, as outlined above, arranged to vary the current supplied to the inverter in response to the state of the inverter itself. In some embodiments, the output terminal of the amplitude regulator is connected to the power terminal of the inverter via a first current mirror circuit portion, said first current mirror circuit portion comprising first and second mirror transistors arranged such that:
 a gate terminal of the first mirror transistor is connected to a gate terminal of the second mirror transistor, a drain terminal of the second mirror transistor, and the output terminal of the amplitude regulator; and
 a drain terminal of the second mirror transistor is connected to the power terminal of the inverter. The source terminals of the mirror transistors are typically connected together and, at least in some embodiments, may be connected to a supply voltage.

It will be appreciated by those skilled in the art that, in accordance with such embodiments, the second mirror transistor is a diode-connected transistor, where the current that flows through the second mirror transistor depends on the output of the amplitude regulator. The current that flows through the second mirror transistor is then 'mirrored' to the first mirror transistor by virtue of the gate terminals of the two mirror transistors being connected together. The two mirror transistors may be, but are not necessarily, substantially identical. However, in some embodiments, the first mirror transistor has a channel width less than a channel width of the second mirror transistor. Those skilled in the art will appreciate that such an arrangement provides the current mirror with gain, such that the current that flows through the diode-connected second mirror transistor is a multiple of the current that flows through the first mirror transistor, where the factor by which it is larger depends on the difference in the channel widths. Such an arrangement may advantageously consume less power than arrangements in which both mirror transistors are the same size. However, providing a current mirror with gain in this way to reduce power consumption may be a trade-off against noise as the gain of the current mirror may amplify noise from the amplitude regulator. In at least some preferred embodiments, the first and second mirror transistors are p-channel metal-oxide-semiconductor field-effect-transistors (pMOSFETs).

Conversely, the digital-to-analogue converter acts as a variable current source such that the current provided to the current inverter can be varied by changing the value of the digital signal. In some embodiments, the digital-to-analogue converter comprises a plurality of transistors connected in parallel and the digital signal comprises a plurality of bits, wherein the digital-to-analogue converter is arranged such that at least some of the plurality of bits are applied to respective gate terminals of at least some of the plurality of transistors. Those skilled in the art will appreciate that, in accordance with such embodiments, the digital signal is a digital word constructed from a number of digital bits, and that some or all of these digital bits are applied to the gate terminals of the transistors, such that the transistors form an addressable array where a desired selection of the transistors can be enabled (with the others disabled) by setting the digital signal to the appropriate value, i.e. by setting each of the digital bits within the digital signal as appropriate.

In some such embodiments, the plurality of transistors include at least two transistors having different widths. For example, the widths of an array of such transistors may increase in powers of two, i.e. they may be N, 2N, 4N, 8N, etc. This may be particularly advantageous where different bits of a digital word are applied to the respective gate terminals of the different transistors because increasingly significant bits of the digital word may add more (and potentially proportionally more) current than less significant bits, allowing selection of the value of current to be selected with relative ease and providing even coverage of the dynamic range with a minimal number of transistors. It will, of course, be appreciated that other such arrangements of transistors having some or all different widths are envisaged and are within the scope of the claimed invention. In at least some preferred embodiments, the plurality of transistors within the digital-to-analogue converter are n-channel metal-oxide-semiconductor field-effect-transistors (nMOSFETs).

The digital-to-analogue converter is, as outlined above, arranged to vary the current supplied to the inverter in response to an applied digital signal. In some embodiments, the output terminal of the digital-to-analogue converter is connected to the power terminal of the inverter via a second current mirror circuit portion, said current mirror circuit portion comprising third and fourth mirror transistors arranged such that:

a gate terminal of the third mirror transistor is connected to a gate terminal of the fourth mirror transistor, a drain terminal of the fourth mirror transistor, and the output terminal of the digital-to-analogue converter; and a drain terminal of the fourth mirror transistor is connected to the power terminal of the inverter. The source terminals of the mirror transistors are typically supplied together and, at least in some embodiments, may be connected to a supply voltage.

Similarly to the first current mirror portion described previously, those skilled in the art will appreciate that the fourth mirror transistor is a diode-connected transistor, where the current that flows through the fourth mirror transistor depends on the output of the digital-to-analogue converter. The current that flows through the second mirror transistor is then 'mirrored' to the first mirror transistor by virtue of the gate terminals of the two mirror transistors being connected together. The third and fourth mirror transistors may be, but are not necessarily, substantially identical. In some embodiments, the third mirror transistor has a channel width less than a channel width of the fourth mirror transistor. Those skilled in the art will appreciate that such an arrangement provides the current mirror with gain as outlined above in relation to the potentially overlapping embodiments wherein the first mirror transistor has a channel width less than that of the second mirror transistor. As explained above, such a current mirror arrangement may advantageously consume less power than arrangements in which both mirror transistors are the same size.

In some embodiments, the first and second terminals of the crystal oscillator are each connected to ground via first and second capacitors respectively. These capacitors, together with the crystal oscillator form band-pass filter (in the form of a pi network), which provides a 180 degree phase shift (i.e. an inverting gain). The combination of this 180 degree phase shift together with the negative gain from the inverter provide positive loop gain and thus positive feedback. Those skilled in the art will appreciate that these load capacitors may improve the frequency stability of the crystal oscillator by reducing the effect of variations in parasitic capacitance.

It will, of course, be appreciated that references to circuits comprising nMOSFETs and pMOSFETs hereinabove may also be implemented with pMOSFETs and nMOSFETs respectively. For example, the DAC may be implemented using pMOSFETs and the output current mirrored via an nMOSFET-based current mirror. The Applicant has appreciated that it may be advantageous in some circumstances to use a particular topology, e.g. based on a DAC reference current source that is in use. Furthermore, the DAC and/or the amplitude regulator may, at least in some embodiments, provide current to the Pierce inverter directly, without using a current mirror. For example, in some arrangements, the DAC may be implemented by pMOSFETs and supply current to the Pierce inverter directly, without using a current mirror to do so.

BRIEF DESCRIPTION OF DRAWINGS

Certain embodiments of the invention will now be described, by way of non-limiting example only, with reference to the accompanying drawings in which:

FIG. 1 is a circuit diagram of an oscillator circuit 102 that uses an amplitude regulator circuit portion 104 in order to generate a current $I_{AREG}$ which is supplied to a so-called 'Pierce inverter' 106 which drives the crystal 108. The amplitude regulator circuit portion 104 limits the current in the Pierce inverter 106 such that the gain is just above the level where oscillations are maintained. A feedback resistor 103 is connected across the inverter 106 and biases the Pierce inverter 106 into its linear operating region.

Figure 1:
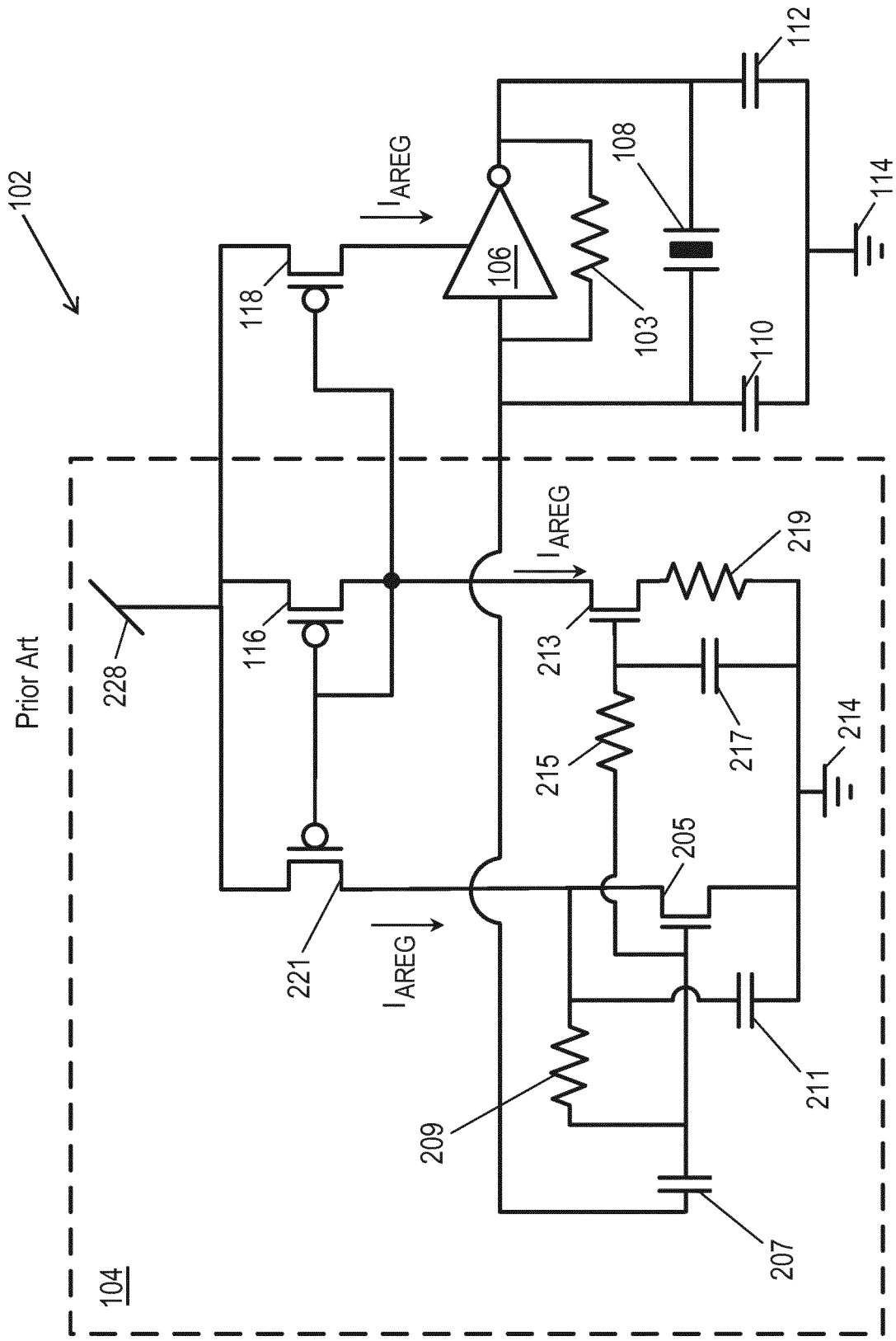
FIG. 1 is a circuit diagram of a prior art oscillator circuit.

The amplitude regulator circuit portion 104 is a conventional proportional to absolute temperature (PTAT) current source, known in the art per se, formed by four transistors 221, 223, 205, 213 and a source degeneration resistor 219 as shown in FIG. 1.

The crystal 108 is a two terminal device, wherein one terminal of the crystal 108 is connected to the input of the Pierce inverter 106 and the other terminal of the crystal 108 is connected to the output of the Pierce inverter 106. The first and second terminals of the crystal 108 are connected to ground 114 via first and second capacitors 110, 112 respectively.

These capacitors 110, 112 and the crystal oscillator 108 form a highly selective band-pass filter (in the form of a pi network) at the resonant frequency of the crystal 108. The band-pass filter network provides a 180 degree phase shift (i.e. an inverting gain) which is combined with the negative gain from the Pierce inverter 106 so as to provide positive loop gain and thus positive feedback. This positive feedback makes the loop deliberately unstable, resulting in oscillation.

When there is no signal at the terminals of the crystal oscillator 208 (e.g. on start up or after a reset), the regulator behaves as a PTAT current source. This is achieved because the transistor 205 is diode-connected through a resistor 209, and the gate voltage of transistor 205 is supplied to the gate of transistor 213 through a fixed resistor 215.

When the amplitude of the oscillations produced by the crystal oscillator 108 ramps up, the gate voltage of transistor 205 will follow due to an AC-coupling capacitor 207 located between the terminal of the crystal oscillator 108 connected to the input of the Pierce inverter 106 and the gate of the transistor 205. The AC component of the gate voltage will reduce the DC voltage due to the non-linear gate-source voltage to drain current transfer function of the MOS transistor 205. This reduces the gate voltage of transistor 213 and $I_{AREG}$ is reduced. As long as transistor 213 operates in its saturation region, the AC voltage to current gain of the loop is close to unity. However, when the transistor 213 enters sub-threshold the gain drops fast and the current is lowered relatively quickly before eventually turning off.

However, the Applicant has appreciated that the arrangement of FIG. 1 has the disadvantage that the amplitude regulator 104 may generate too much noise for certain applications, especially low power applications where the gain in the current mirror (formed by two transistors 116, 118) may be relatively high. This gain directly amplifies the noise generated in the amplitude regulator circuit portion 104.

One alternative solution may be to use a fixed, low noise current source to supply the current into the transistor 116 that mirrors current into the transistor 118 connected to the Pierce inverter 106, and to remove the rest of the amplitude regulator circuit portion 104. However, doing so would limit the range of crystals that can be used as the crystal 108 within the oscillator.

Figure 2:
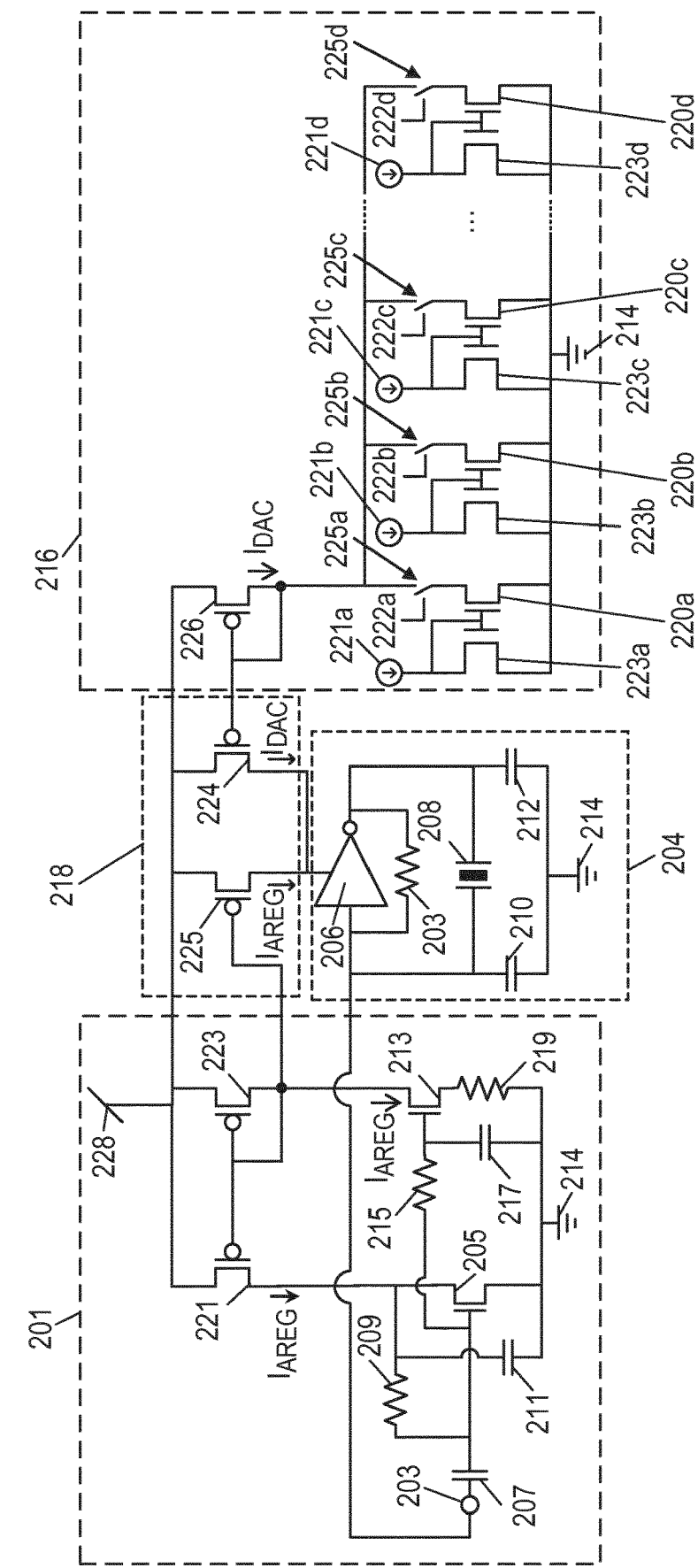
FIG. 2 is a circuit diagram of an oscillator circuit in accordance with an embodiment of the present invention.

FIG. 2 is a circuit diagram of an oscillator circuit 202 in accordance with an embodiment of the present invention which solves the problem outlined above. The oscillator circuit 202 comprises an oscillator portion 204 which is constructed from a Pierce inverter 206, a crystal oscillator 208 (which may, for example, be a quartz crystal), and a pair of capacitors 210, 212.

The oscillator portion 208 is arranged such that the Pierce inverter 206 is in parallel with the crystal oscillator 208, i.e. a first terminal of the crystal oscillator 208 is connected to the input terminal of the Pierce inverter 206 and a second terminal of the crystal oscillator 208 is connected to the output terminal of the Pierce inverter 206. The input terminal of the Pierce inverter 206 and the first terminal of the crystal oscillator 208 are connected to ground 214 via the first capacitor 210, while the output terminal of the Pierce inverter 206 and the second terminal of the crystal oscillator 208 are connected to ground 214 via the second capacitor 212. A feedback resistor 203 is connected across the inverter 206 (i.e. between the input and output terminals of the Pierce inverter 206) and biases the Pierce inverter 206 into its linear operating region.

These capacitors 210, 212 form a pi network band-pass filter with the crystal oscillator 208. This band-pass filter arrangement provides a 180 degree phase shift (i.e. an inverting gain). The combination of this 180 degree phase shift together with the negative gain from the Pierce inverter 206 provide positive loop gain and thus positive feedback. As outlined previously, this positive feedback arrangement results in the desired oscillations.

The power terminal of the Pierce inverter 206 is connected to an amplitude regulator portion 201 via a current mirror portion 218, each of which are described in further detail below. The power terminal of the Pierce inverter 206 is also connected to a DAC portion 216 via the current mirror portion 218, where this DAC portion 216 is also described below.

The amplitude regulator portion 201 comprises an input terminal 203, which is connected to the input terminal of the Pierce inverter 206 and to the gate terminal of an NMOS transistor 205 via a DC-blocking capacitor 207. The drain terminal of the NMOS transistor 205 is connected to its gate terminal via a feedback resistor 209 and to ground 214 via a decoupling capacitor 211. The source terminal of the NMOS transistor 205 is connected to ground 214.

The gate terminal of this NMOS transistor 205 is also connected to the gate terminal of a further NMOS transistor 213 via an RC low-pass filter constructed from a resistor 215 and a capacitor 217, where the resistor 215 is connected between the gate terminals of the transistors 205, 213 and the capacitor 217 is connected such that one terminal of the capacitor 217 is connected between the resistor 215 and the gate terminal of the second NMOS transistor 213, and the other terminal of the capacitor 217 is connected to ground 214.

The source terminal of the second NMOS transistor 213 is connected to ground 214 via a further resistor 219 and the drain terminal of the second NMOS transistor 213 is connected to a current mirror constructed from a pair of PMOS transistors 221, 223. The gate terminal of the first of these PMOS transistors 221 is connected to the gate and drain terminals of the second PMOS transistor 223, i.e. the second PMOS transistor 223 is diode-connected.

The respective source terminals of each of the PMOS transistors 221, 223 are connected to a supply voltage 228. The drain terminal of the first PMOS transistor 221 is connected to the drain terminal of the previously described NMOS transistor 205 which has its gate terminal connected to the input terminal 203 via the DC-blocking capacitor 207. The drain terminal of the second PMOS transistor 223 is connected to the drain terminal of the previously described NMOS transistor 213 which has its gate terminal connected to the gate terminal of the other NMOS transistor 205 via the RC low-pass filter 215, 217.

The gate and drain terminals of the second PMOS transistor 223 are further connected to the gate terminal of a further PMOS transistor 225 within the current mirror portion 218. This further PMOS transistor 225 is arranged such that its source terminal is connected to the supply voltage 228 and its drain terminal is connected to the power terminal of the Pierce inverter 206.

Therefore it can be seen that the current $I_{AREG}$ that flows through the diode-connected PMOS transistor 223 and connected NMOS transistor 213 is mirrored through both of the PMOS transistors 221, 225 to which its gate and drain terminals are connected.

The DAC portion 216 comprises a number of NMOS transistors 220a-d connected in parallel. While, in this particular example, four transistors 220a-d are shown, it will be appreciated that the number of transistors used may be varied as desired, as indicated by the " . . . " depicted in FIG. 2. The source terminals of each of these transistors 220a-d are connected to ground 214.

The gate terminals of each of the transistors 220a-d are connected to respective diode-connected transistors 221a-d so as to form respective current mirrors, wherein each current mirror is arranged to mirror a source current produced by a respective current source 223a-d through the corresponding transistor 220a-d. These current sources 221a-d may, in practice, be individual current sources, but in some arrangements two or more of the current sources 221a-d may be the same, for example all of the current sources 221a-d may be the same current source.

The respective drain terminals of the NMOS transistors 220a-d are each connected to a corresponding switch 225a-d, the operation of which is controlled by a respective control signal 222a-d. These control signals 222a-d are typically generated by an external controller (not shown). Each of the control signals 222a-d forms one bit of an n-bit (in this case, 4-bit) control word, where each of the control signals 222a-d may be set to binary '0' or binary '1' in order to respectively disconnect or connect the corresponding transistor 220a-d and the current mirror portion 218.

In this example, the most significant bit is the first control signal 222a, the second most significant bit is the second control signal 222b, the third most significant bit is the third control signal 222c, and the least significant bit is the fourth control signal 222d.

While different scales could be used, in this particular non-limiting example, each of the transistors 220a-d has a different channel width and thus has a different conductance. In this case, a binary scale is used such that the transistor 220a connected to the switch 225a to which the signal 222a, corresponding to the most significant bit, is applied has double the channel width of the transistor 220b connected to the switch 225b to which the signal 222b, corresponding to the second most significant bit, is applied. The first transistor 220a can therefore supply double the current that the second transistor 220b can.

Similarly, the transistor 220b connected to the switch 225b to which the signal 222b, corresponding to the second most significant bit, is applied has double the channel width of the transistor 220c connected to the switch 225c to which the signal 222c, corresponding to the third most significant bit, is applied. The second transistor 220b can therefore supply double the current that the third transistor 220c can.

Finally, the channel width of the transistor 220c connected to the switch 225c to which the signal 222c, corresponding to the third most significant bit, is applied has double the channel width of the transistor 220d connected to the switch 225d to which the signal 222d, corresponding to the least significant bit, is applied. The third transistor 220c can therefore supply double the current that the fourth transistor 220d can.

Therefore, more succinctly, if the fourth transistor 220d supplies a current 1×, then the third transistor 220c supplies a current 2×, the second transistor 220b supplies a current 4×, and the first transistor supplies a current 8×. By extension, using this binary scale with n transistors, the $n^{th}$ transistor will supply a current $2^n$×.

The current mirror portion 218 comprises a pair of PMOS transistors 224, 226 arranged to form a current mirror. The gate terminal of the first PMOS transistor 224 is connected to the gate and drain terminals of the second PMOS transistor 226. The respective source terminals of each of the PMOS transistors 224, 226 are connected to a supply voltage 228. The drain terminal of the first PMOS transistor 224 is connected to the power terminal of the Pierce inverter 206. The drain terminal of the second PMOS transistor 226 is connected to the drain terminals of each of the NMOS transistors 220a-d within the DAC portion 216 via the respective switch 225a-d (and to the gate terminals of both PMOS transistors 224, 226 as above). In other words, the second PMOS transistor 226 is diode-connected.

Depending on the values to which each of the control signals 222a-d are set, different combinations of the NMOS transistors 220a-d within the DAC portion 216 are enabled or disabled respectively. For example, if a 4-bit control word 0b1010 is applied, then two of the control signals 222a, 222c are set to binary '1' and the corresponding transistors 220a, 220c are enabled. Meanwhile, the other two control signals 222b, 222d are set to binary '0' and so the corresponding transistors 220b, 220d are disabled.

Following this example, if the 4-bit control word is set to 0b1010 as above, the resulting current $I_{DAC}$ through the DAC portion 216 is the sum of the currents through the enabled transistors 222a, 222c. Using the binary scale outlined above, this results in a current $I_{DAC}$ through the DAC portion 216 of 10× (i.e. the sum of 8× from the first transistor 220a and 2× from the third transistor 220c).

This current $I_{DAC}$ that flows through the DAC portion 216, flows through the second PMOS transistor 226 in the mirror circuit portion 226. Due to the current mirror arrangement, this same current $I_{DAC}$ then flows through the first PMOS transistor 224 to the Pierce inverter 206.

As explained previously it is important to have the correct current level in order to operate the Pierce inverter 206 in its linear operating region so that the oscillator portion 204 produces the desired oscillations. Thus, through appropriate choice of the digital word input to the DAC portion 216, the current provided to the oscillator portion 204 can advantageously be set to a variety of values, and thus many different crystal oscillators 208 can be used. Furthermore, the DAC arrangement does not suffer the noise problems that amplitude regulator arrangements (such as the one shown in FIG. 1) do. It will be understood that, a digital signal applied to the gates of the NMOS transistors 220a-d results in an analogue current $I_{DAC}$ being generated, which is then supplied to the Pierce inverter as explained above, i.e. the arrangement forms a digital-to-analogue converter.

The amplitude regulator portion 201 is provided, effectively in parallel with the DAC portion 216. When the oscillator circuit 202 is powered up, e.g. after the device is powered on or when waking from a low-power mode, the DAC portion 216 may not be immediately ready to supply sufficient current $I_{DAC}$ to the Pierce inverter 206.

However, the amplitude regulator portion 201 can produce its supply current $I_{AREG}$ practically immediately. Once amplitude of the oscillations reaches the desired level and thus the current $I_{DAC}$ produced by the DAC portion 216 is sufficient to maintain the amplitude of the oscillations, the amplitude regulator portion 201 automatically reduces the amount of current $I_{AREG}$ it supplies as explained below.

The amplitude regulator portion 201 and the DAC portion 216 both start at the same time, but the amplitude regulator portion 201 produces a much greater current than the DAC portion when the crystal oscillator 208 is not producing oscillations. The high current produced by the amplitude regulator portion 201 results in a high transconductance ($g_m$) gain of the Pierce inverter 206, which in turn reduces the start-up time of the oscillator circuit 202. When the amplitude of the oscillations produced by the oscillator portion 208 is sufficiently high, the current from the amplitude regulator portion 201 significantly reduces. When the current produced by the DAC portion 216 is sufficient to sustain the oscillations at the desired level, the amplitude regulator portion 201 stops providing current.

Thus it will be appreciated by those skilled in the art that embodiments of the present invention provide an improved crystal oscillator circuit that uses an amplitude regulator to provide a relatively large current to the oscillator in order to give an acceptable start-up time of the oscillator, but that switches to a more noise-resilient fixed current source (i.e. the DAC) that provides sufficient current to maintain oscillations once the amplitude of the oscillations is sufficient. Furthermore, because the current supplied by the DAC can be controlled by the digital control signal, the crystal oscillator circuit described herein may be compatible with a wider variety of crystals than a simple fixed current source. It will be appreciated by those skilled in the art that the embodiments described above are merely exemplary and are not limiting on the scope of the invention.

The invention claimed is:

1. An oscillator circuit comprising:
   a crystal oscillator having first and second terminals;
   an inverter having an input terminal and an output terminal, wherein the input terminal of the inverter is connected to the first terminal of the crystal oscillator and the output terminal of the inverter is connected to the second terminal of the crystal oscillator, and wherein the oscillator circuit is arranged to operate the inverter in its linear operating region;
   an amplitude regulator having an input terminal thereof connected to the input terminal of the inverter, arranged to provide a first supply current to the inverter, said first supply current having a magnitude inversely dependent on a magnitude of a voltage at the inverter input terminal, wherein the amplitude regulator is disabled if the magnitude of the voltage at the input terminal of the amplitude regulator is above a threshold value but the amplitude regulator is enabled if the magnitude of the voltage at the input terminal of the amplitude regulator is not above the threshold value; and
   a digital-to-analogue converter arranged to provide a second supply current to the inverter having a magnitude determined by a digital signal applied to a digital input of said digital-to-analogue converter.

2. The oscillator circuit as claimed in claim 1, wherein the amplitude regulator provides the first supply current on power-up of the oscillator circuit.

3. The oscillator circuit as claimed in claim 1, wherein the threshold value is the magnitude of the first supply current produced by the amplitude regulator when the magnitude of the second supply current is zero.

4. The oscillator circuit as claimed in claim 1, wherein a resistor is connected in parallel with the inverter such that a first terminal of the resistor is connected to the input terminal of the inverter and a second terminal of the resistor is connected to the output terminal of the inverter, wherein the resistor is arranged to bias the inverter to operate in a linear operating region thereof.

5. The oscillator circuit as claimed in claim 1, wherein the inverter is a digital inverter.

6. The oscillator circuit as claimed in claim 1, wherein an output terminal of the amplitude regulator is connected to the power terminal of the inverter via a first current mirror circuit portion, said first current mirror circuit portion comprising first and second mirror transistors arranged such that:
   a gate terminal of the first mirror transistor is connected to a gate terminal of the second mirror transistor, a drain terminal of the second mirror transistor, and the output terminal of the amplitude regulator; and
   a drain terminal of the second mirror transistor is connected to the power terminal of the inverter.

7. The oscillator circuit as claimed in claim 6, wherein the first mirror transistor has a channel width less than a channel width of the second mirror transistor.

8. The oscillator circuit as claimed in claim 1, wherein the digital-to-analogue converter comprises a plurality of transistors connected in parallel and the digital signal comprises a plurality of bits, wherein the digital-to-analogue converter is arranged such that at least some of the plurality of bits are applied to respective gate terminals of at least some of the plurality of transistors.

9. The oscillator circuit as claimed in claim 8, wherein the plurality of transistors include at least two transistors having different widths.

10. The oscillator circuit as claimed in claim 1, wherein an output terminal of the digital-to-analogue converter is connected to the power terminal of the inverter via a second current mirror circuit portion, said current mirror circuit portion comprising third and fourth mirror transistors arranged such that:
    a gate terminal of the third mirror transistor is connected to a gate terminal of the fourth mirror transistor, a drain terminal of the fourth mirror transistor, and the output terminal of the digital-to-analogue converter; and
    a drain terminal of the fourth mirror transistor is connected to the power terminal of the inverter.

11. The oscillator circuit as claimed in claim 10, wherein the third mirror transistor has a channel width less than a channel width of the fourth mirror transistor.

12. The oscillator circuit as claimed in claim 1, wherein the first and second terminals of the crystal oscillator are each connected to ground via first and second capacitors respectively.

13. A method of operating an oscillator circuit comprising:
    a crystal oscillator having first and second terminals;
    an inverter having an input terminal and an output terminal, wherein the input terminal of the inverter is connected to the first terminal of the crystal oscillator and the output terminal of the inverter is connected to the second terminal of the crystal oscillator, and wherein the oscillator circuit is arranged to operate the inverter in its linear operating region;

an amplitude regulator having an input terminal thereof connected to the input terminal of the inverter, arranged to provide a first supply current to the inverter, wherein the amplitude regulator is disabled if the magnitude of the voltage at the input terminal of the amplitude regulator is above a threshold value but the amplitude regulator is enabled if the magnitude of the voltage at the input terminal of the amplitude regulator is not above the threshold value; and a digital-to-analogue converter arranged to provide a second supply current to the inverter;

wherein the method comprises:

using the amplitude regulator to determine a first supply current;

varying the magnitude of the first supply current inversely in response to the magnitude of the voltage at the input terminal of the amplitude regulator;

using the digital-to-analogue converter to determine a second supply current; and varying the magnitude of the second supply current in response to a digital signal applied to a digital input of said digital-to-analogue converter.

* * * * *